(12) United States Patent
Suh

(10) Patent No.: US 7,205,572 B2
(45) Date of Patent: Apr. 17, 2007

(54) ORGANIC ELECTROLUMINESCENT DISPLAY DEVICE

(75) Inventor: Mi-Sook Suh, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 330 days.

(21) Appl. No.: 10/965,415

(22) Filed: Oct. 13, 2004

(65) Prior Publication Data

US 2005/0078105 A1 Apr. 14, 2005

(30) Foreign Application Priority Data

Oct. 14, 2003 (KR) .................. 10-2003-0071594

(51) Int. Cl.
  H01L 29/04 (2006.01)
  H01L 31/036 (2006.01)
  H01L 33/00 (2006.01)
(52) U.S. Cl. .................................. 257/72; 257/89
(58) Field of Classification Search ............ 257/69–72, 257/40, 89–103
See application file for complete search history.

(56) References Cited

U.S. PATENT DOCUMENTS

2004/0012058 A1* 1/2004 Aoki ........................ 257/414
2006/0006417 A1* 1/2006 Kim et al. ................. 257/197

FOREIGN PATENT DOCUMENTS

| JP | 61-164637 | 1/1988 |
| JP | 63-21623 | 1/1988 |
| JP | 2003-195785 | 7/2003 |

OTHER PUBLICATIONS

Patent Abstracts of Japan, Publication No. 2003-195785; Publication Date Sep. 7, 2003; in name of Kazuhiro.

* cited by examiner

Primary Examiner—Cuong Nguyen
(74) Attorney, Agent, or Firm—Christie, Parker & Hale, LLP

(57) ABSTRACT

A display device in which charge damage occurring at wiring near the periphery is prevented or reduced, and wiring is facilitated during manufacturing by controlling an angle of an edge part of the wiring near the periphery. A display device includes a substrate, a pixel region including a plurality of unit pixels formed on the substrate. A power supply voltage line supplies a power supply voltage to the pixel region, and a cathode voltage line supplies a cathode voltage to the pixel region. The power supply voltage line includes an edge part formed in an obtuse angle. The edge part of wiring adjacent to the power supply voltage line may also be formed in an obtuse angle. Further, a cathode voltage line and a scan driver each may include an edge part formed in an obtuse angle. The display device may be an organic electroluminescent display device.

22 Claims, 6 Drawing Sheets

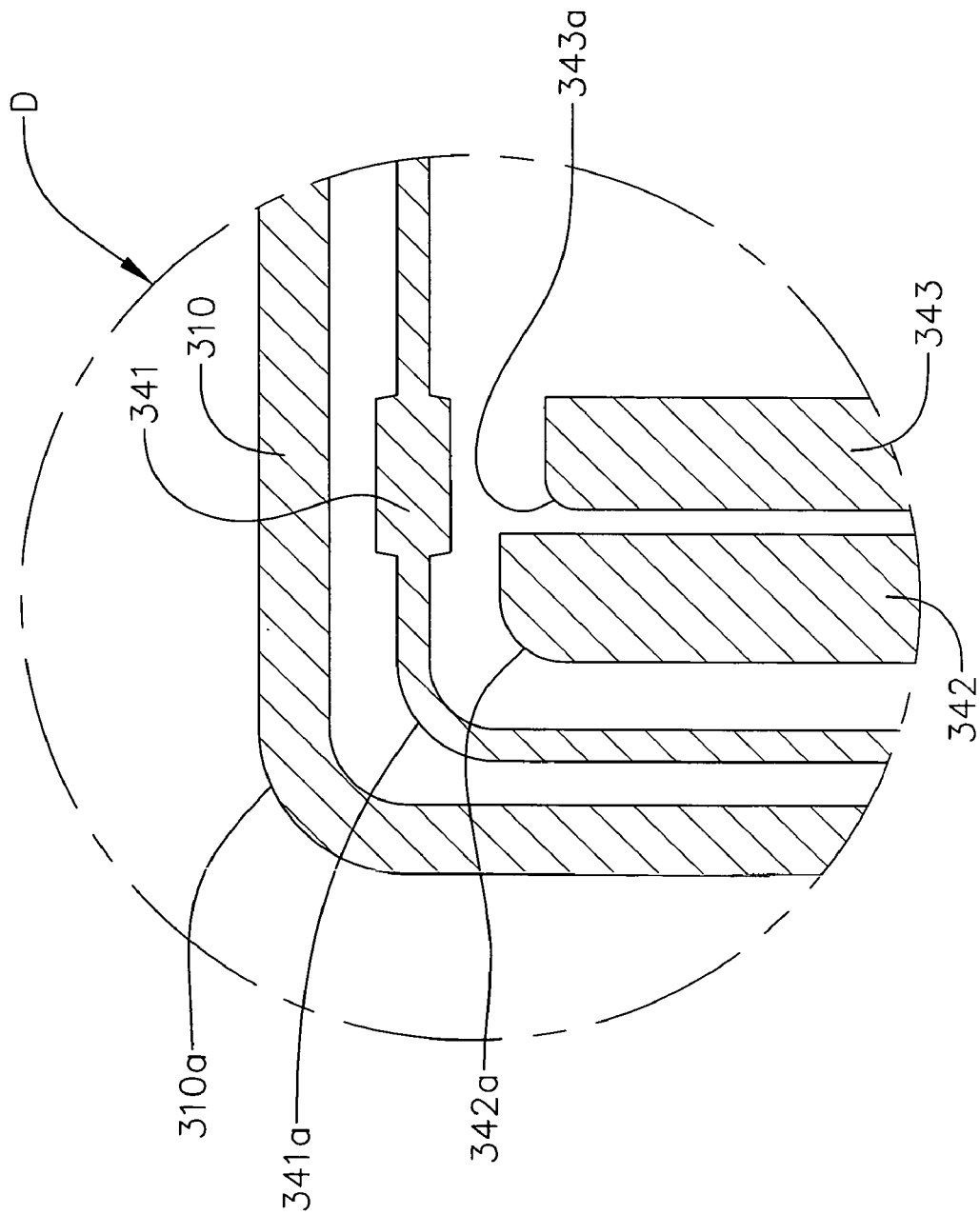

ORGANIC ELECTROLUMINESCENT DISPLAY DEVICE

CROSS REFERENCE TO RELATED APPLICATIONS

This application claims priority to and the benefit of Korean Patent Application No. 2003-71594, filed on Oct. 14, 2003, the entire disclosure of which is incorporated herein by reference in its entirety.

BACKGROUND OF THE INVENTION

1. Field of the Invention

The present invention relates to an organic electroluminescent display device, and more particularly, to an organic electroluminescent display device in which charge damage occurring at wiring near the periphery is prevented or reduced, and wiring is facilitated during manufacturing by controlling an angle of an edge part of the wiring near the periphery.

2. Description of Related Art

Display devices using light emitting elements including organic electroluminescent (EL) device have actively been developed lately. The organic EL device is suitable for a display device having a thin profile and enhanced viewing angles since backlight required in liquid crystal display devices is not required as the organic EL device is a self-emitting display device.

A type of organic EL device has a structure in which an organic thin film layer is formed between the anode that is a transparent electrode such as ITO and the cathode fabricated using a metal having low work function such as Ca, Li and Al. When a forward voltage is applied to the organic EL device, holes and electrons are respectively injected from the anode and the cathode, the injected holes and electrons are combined to form excitons, and the excitons are emitted and recombined to cause electroluminescence.

An organic electroluminescent display device 100 using the above-referenced organic EL device is illustrated in FIG. 1, which is a plan view for showing a conventional organic electroluminescent display device.

The organic electroluminescent device 100 includes an upper power supply voltage line 110, a lower power supply voltage line 120, a cathode voltage line 130, a scan driver 140, a data driver 150, an active power supply voltage line 160 and a pixel region 170.

As illustrated in FIG. 1, the organic electroluminescent display device 100 includes the pixel region 170 on which unit pixels emitted in certain colors are arranged at a central part. The upper and lower power supply voltage lines 110, 120 supply a power supply voltage from upper and lower sides, respectively, of the pixel region 170. The scan driver 140 applies a selection signal to one side of the pixel region 170, and the cathode voltage line 130 transmits a cathode voltage to the other side of the pixel region 170. The data driver 150 applies a data signal to the pixel region 170 from a location below the lower power supply voltage line 120.

In the organic electroluminescent display device 100, a power supply voltage is applied to the pixel region 170 through the active power supply voltage line 160 from the upper power supply voltage line 110 and the lower power supply voltage line 120. Further, a cathode voltage is applied to the pixel region 170 from the cathode voltage line 130. When a selection signal and a data signal are applied from the scan driver 140 and the data driver 150, respectively, driving circuits formed at unit pixels are switched on so that a certain image is displayed on the pixel region 170 by applying currents corresponding to the power supply voltage and the data signal to organic EL devices (not illustrated in FIG. 1) formed at the pixel region 170.

The organic electroluminescent display device 100 is wired with a plurality of power supply lines and signal lines so that a certain power supply is supplied to the scan driver 140 and the data driver 150 to drive the organic EL devices. A part A of FIG. 1 is described below as one example of wiring and arrangement near the periphery of a conventional organic electroluminescent display device.

FIG. 2 is an expanded plan view of the part A of FIG. 1.

As seen in FIG. 2, a signal line 141, a scan driver power supply voltage line 142 and a scan driver cathode voltage line 143 are formed near the upper power supply voltage line 110. The scan driver cathode voltage line 143 may also be referred to as a ground voltage line or a grounding voltage line.

The upper power supply voltage line 110 is bent at a perpendicular angle, and has edge parts located at corners where the horizontal portion of the upper power supply voltage line 110 is connected to the vertical portions of the upper power supply voltage line 110. The signal line 141 is arranged along the upper power supply voltage line 110 and is similarly bent at a perpendicular angle. Further, the power supply voltage line 142 and the scan driver cathode voltage line 143 for transmitting a power supply voltage to the scan driver 140 are formed at an inner side of the signal line 141. It can be seen in FIG. 2 that the power supply voltage line 142 and the scan driver cathode voltage line 143 are parallel to each other and run adjacently to each other along the vertical portion of the power supply voltage line 142.

In a conventional organic electroluminescent display device, a power supply voltage line is wired near the periphery and has a width wider than other wirings in consideration of the voltage drop. However, since respective edge parts of conventional power supply voltage line and other wirings are perpendicularly wired in the same direction, the length of the conventional power supply voltage line and other wirings is increased, and charges are accumulated on edge parts during manufacturing process due to charge characteristics. In other words, the smaller the angle of the edge parts and the sharper edges are, the easier charges are accumulated on the edge parts. Therefore, the conventional organic electroluminescent display device suffers from a disorder occurred by charge damage to inner wirings and metal patterns since charges are distributed between adjacent wirings having the edge parts bent in the same direction according to the degree of accumulation of the charges. In addition, wirings are not easily arranged in the conventional organic electroluminescent display device because the edge parts are perpendicularly constructed so that space efficiency is reduced.

SUMMARY OF THE INVENTION

Therefore, in order to solve the foregoing problems in the conventional organic electroluminescent display device, in exemplary embodiments of the present invention, charges between adjacent wirings are substantially uniformly distributed in an organic electroluminescent display device by generally rounding the wirings near the periphery and bending the generally rounded wirings to a certain angle, thereby relieving the degree of accumulation of the charges on edge parts, and increasing arrangement efficiency of wirings and metal patterns by generally rounding the edge parts.

In an exemplary embodiment of the present invention, a display device includes a substrate, a pixel region including a plurality of pixels formed on the substrate, a power supply voltage line for supplying a power supply voltage to the pixel region, and a cathode voltage line for supplying a cathode voltage to the pixel region. The power supply voltage line includes an edge part formed in an obtuse angle. An edge part of wiring adjacent to the edge part of the power supply voltage line may be formed in an obtuse angle. The cathode voltage line may also include an edge part formed in an obtuse angle. In addition, the scan driver may include an edge part formed in an obtuse angle. The edge parts may be formed in an obtuse angle of more than 90 degrees. The display device may be an organic electroluminescent display device.

In another exemplary embodiment of the present invention, a display device includes a pixel region including a plurality of pixels, a power supply voltage line for supplying a power supply voltage to the pixel region, a cathode voltage line for supplying a cathode voltage to the pixel region, a signal line adjacent to the power supply voltage line, a scan driver power supply line for transmitting a power supply voltage to a scan driver, and a scan driver cathode voltage line for transmitting the cathode voltage to the scan driver. The power supply voltage line includes an edge part formed in a generally rounded shape. The cathode voltage line and the scan driver each may include an edge part formed in a generally rounded shape. In addition, the signal line may include an edge part formed in a generally rounded shape. Further, the scan driver power supply line may include an edge part formed in a generally rounded shape. Further, the scan driver cathode voltage line may include an edge part formed in a generally rounded shape. The display device may be an organic electroluminescent display device.

In yet another exemplary embodiment of the present invention, a display device includes a pixel region and a power supply voltage line for supplying a power supply voltage to the pixel region. The power supply voltage line has a substantially horizontal portion having a first end and a second end, a substantially vertical portion, and an edge part interconnecting the first end of the substantially horizontal portion and the substantially vertical portion. The edge part forms an obtuse angle with both the substantially horizontal portion and the substantially vertical portion.

In yet another exemplary embodiment of the present invention, a display device includes a pixel region having a plurality of pixels formed thereon, and a power supply voltage line for supplying a power supply voltage to the pixel region. The power supply voltage line has a substantially horizontal portion, a first substantially vertical portion, a second substantially vertical portion, a first edge part interconnecting a first end of the substantially horizontal portion and the first substantially vertical portion, and a second edge part interconnecting a second end of the substantially horizontal portion and the second substantially vertical portion. A cathode voltage line is disposed proximate to and substantially parallel to the second substantially vertical portion. The cathode voltage line supplies a cathode voltage to the pixel region, and has an edge part located at a corner proximate to the second edge part and formed in an angle and direction which is generally the same as that of the second edge part. A scan driver is disposed proximate to and substantially parallel to the first substantially vertical portion. The scan driver supplies a selection signal to the pixel region, and has an edge part located at a corner proximate to the first edge part and formed in substantially the same direction as and at an angle which is generally the same as that of the first edge part. A scan driver cathode voltage line is disposed proximate to and substantially parallel to the scan driver. The scan driver cathode voltage line transmits a scan driver cathode voltage to the scan driver, and has an edge part located at a corner proximate to the first edge part and formed in substantially the same direction as and at an angle which is generally the same as that of the first edge part. A scan driver power supply line is disposed proximate to and substantially parallel to the scan driver. The scan driver power supply line transmits a scan driver power supply voltage to the scan driver, and has an edge part located at a corner proximate to the first edge part and formed in substantially the same direction as and at an angle which is generally the same as that of the first edge part. A signal line is disposed adjacent to the power supply voltage line, and has a substantially horizontal portion, a substantially vertical portion and an edge part interconnecting therebetween. The edge part of the signal line is adjacent to the first edge part and formed in substantially the same direction as and at an angle which is generally the same as that of the first edge part. The first edge part forms an obtuse angle with both the substantially horizontal portion and the first substantially vertical portion of the power supply voltage line. The second edge part forms an obtuse angle with both the substantially horizontal portion and the second substantially vertical portion of the power supply voltage line.

BRIEF DESCRIPTION OF THE DRAWINGS

The above and other features of the present invention will become more apparent to those of ordinary skill in the art with the following description in detail of certain exemplary embodiments thereof with reference to the attached drawings in which:

FIG. 6 is an expanded plan view of a part D of FIG. 5.

DETAILED DESCRIPTION

Figure 1:
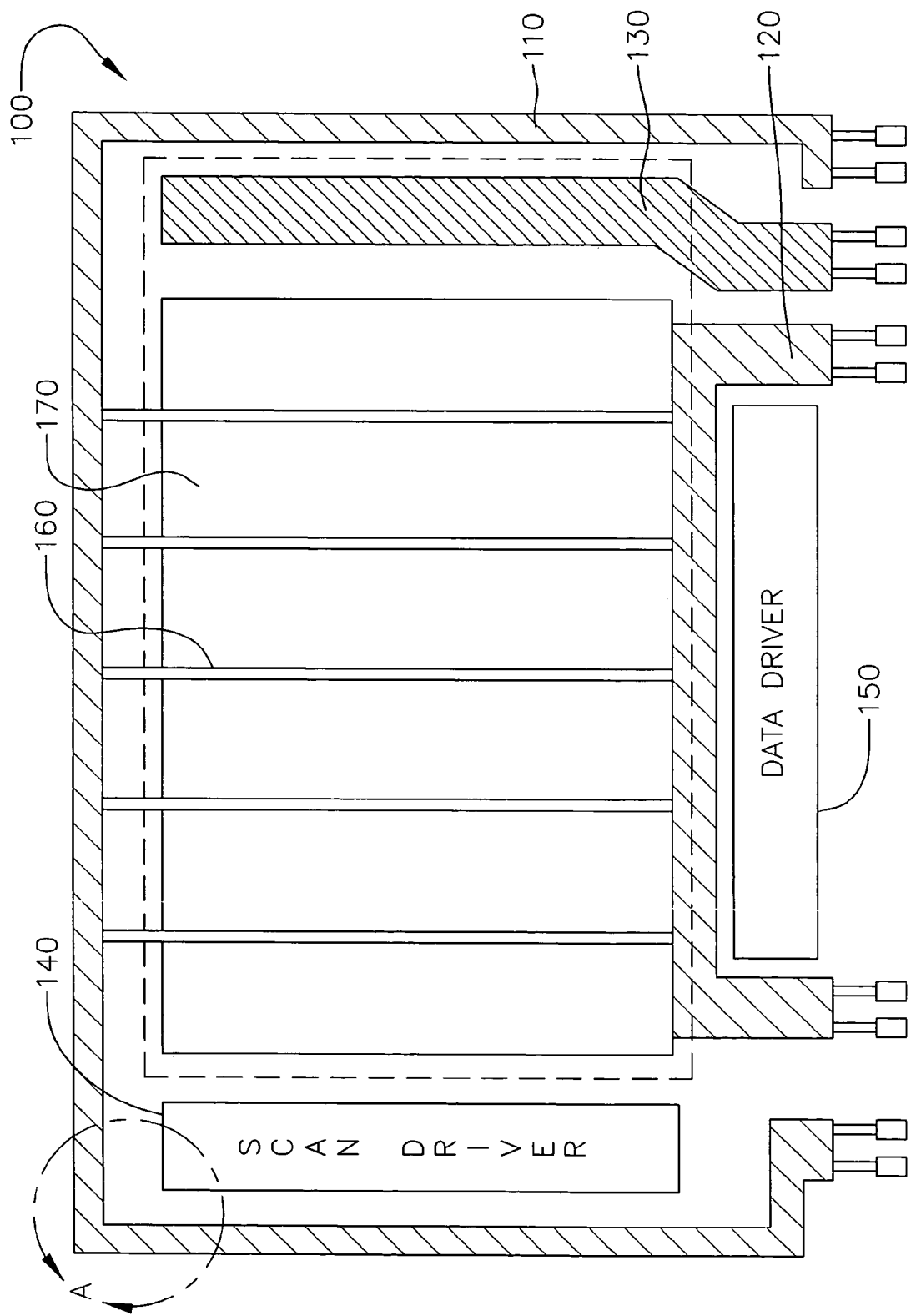
FIG. 1 is a plan view showing a conventional organic electroluminescent display device.
Figure 2:
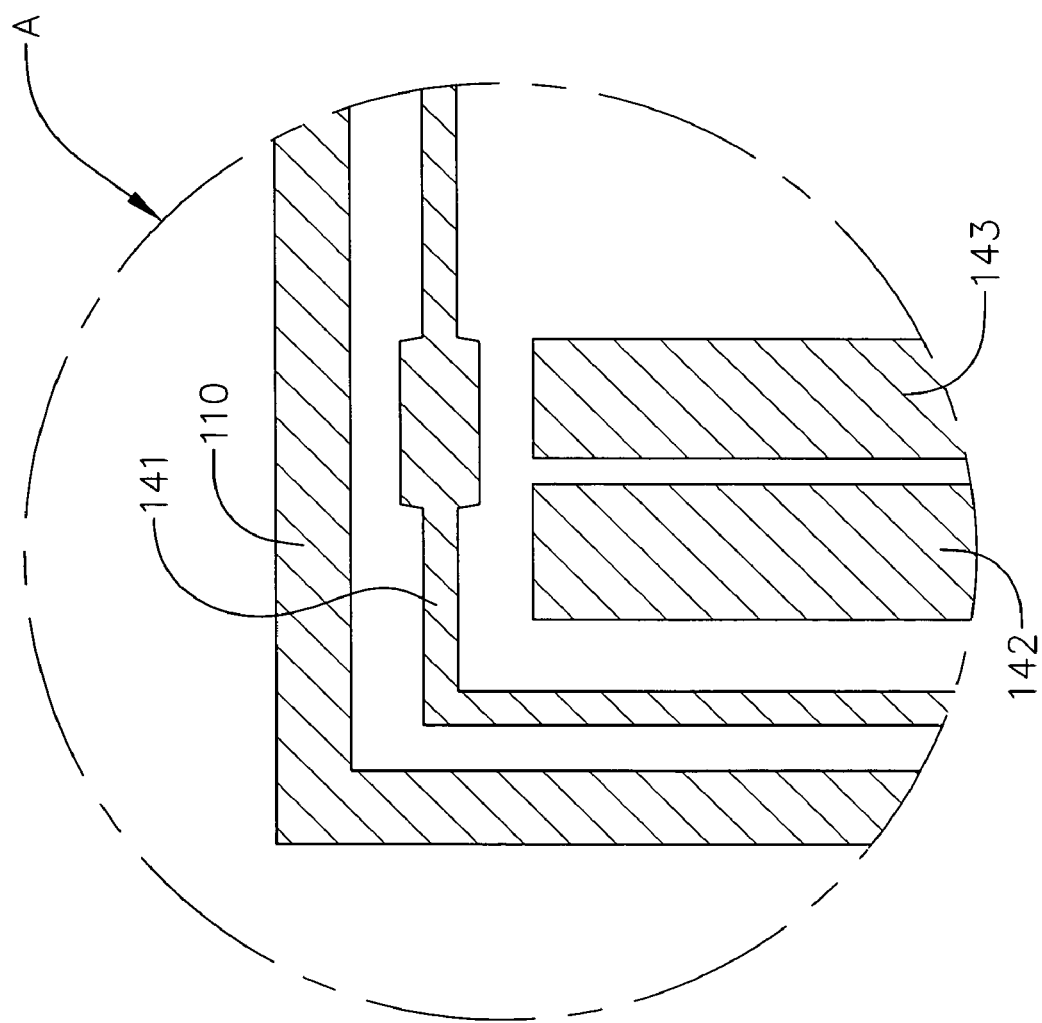
FIG. 2 is an expanded plan view of a part A of FIG. 1.

The present invention will now be described in detail in connection with certain exemplary embodiments with reference to the accompanying drawings. In the drawings, like reference numerals/characters designate like elements.

Figure 3:
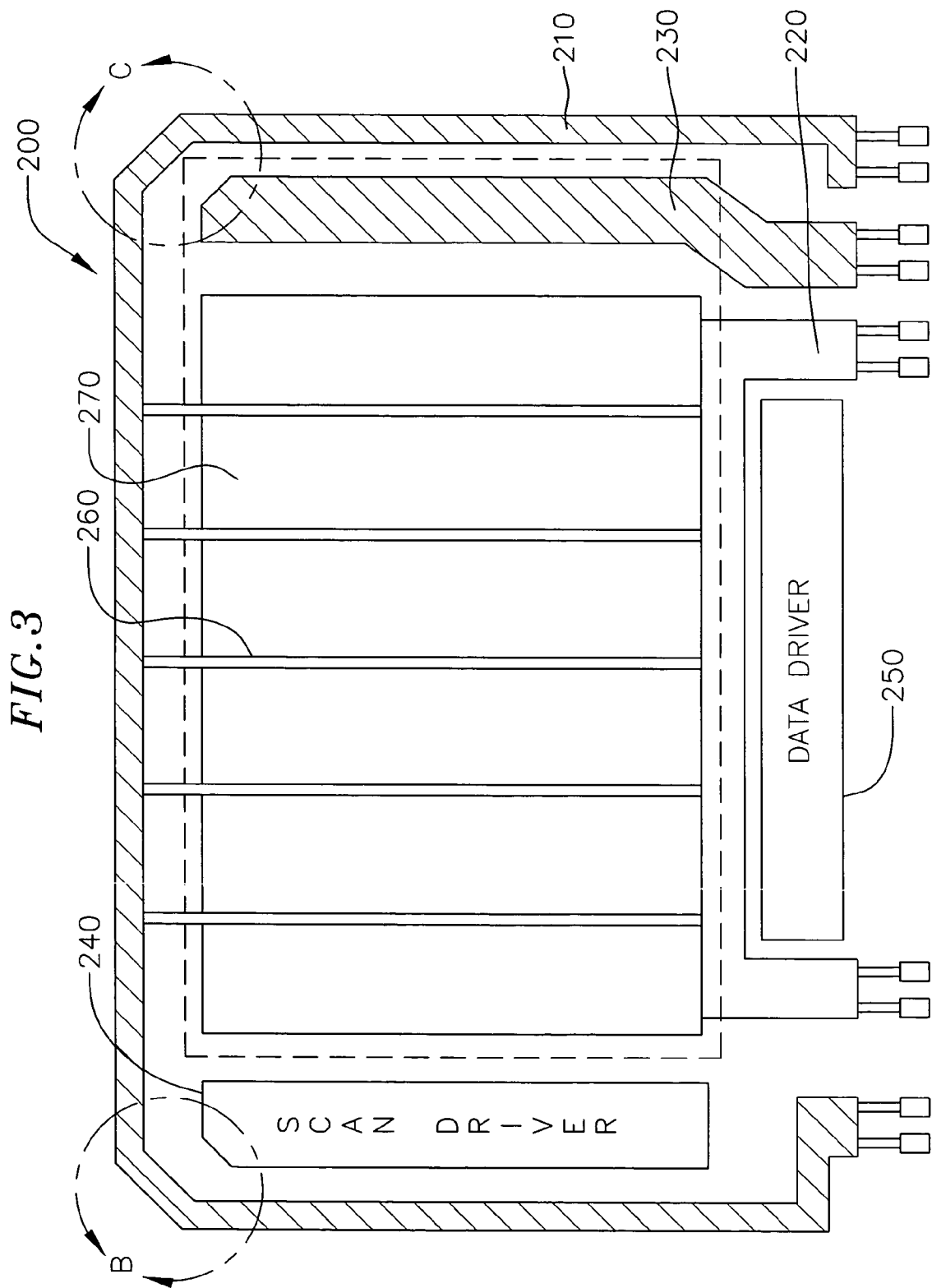
FIG. 3 is a plan view showing an exemplary embodiment according to the present invention.

FIG. 3 is a plan view showing one exemplary embodiment of the present invention.

An organic electroluminescent display device 200 includes an upper power supply voltage line 210, a lower power supply voltage line 220, a cathode voltage line 230, a scan driver 240, a data driver 250, an active power supply voltage line 260 and a pixel region 270 having a plurality of unit pixels for emitting light of certain colors, formed on a substrate.

In FIG. 3, edge parts of the upper power supply voltage line 210 in both parts B, C are formed in an obtuse angle having more than 90 degrees. Additionally, edge parts on wirings adjacent to the edge parts of the upper power supply voltage line 210 should also be formed in an obtuse angle as shown in FIG. 4.

Figure 4:
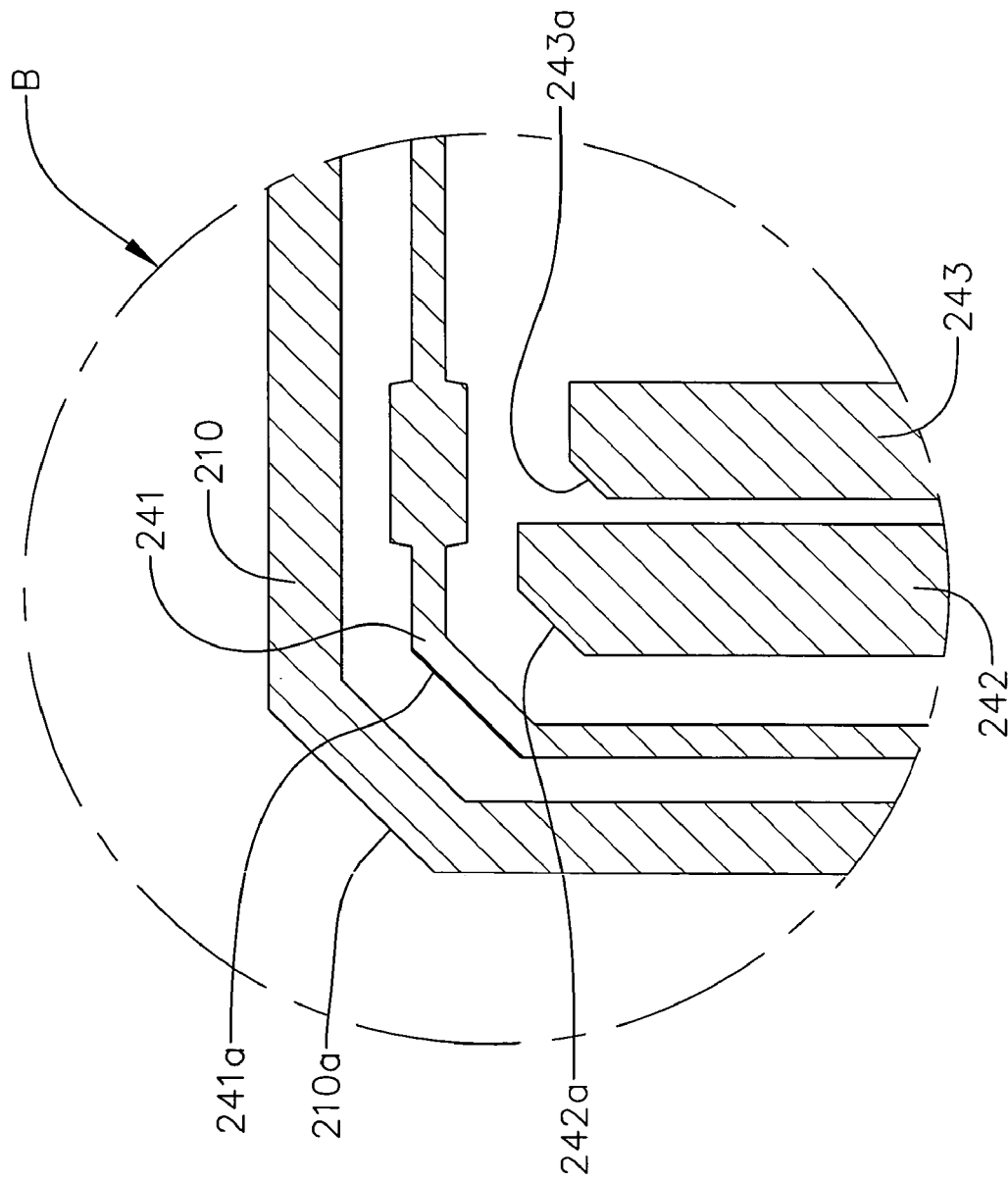
FIG. 4 is an expanded plan view of a part B of FIG. 3.

While FIG. 4 only shows an expanded plan view of the part B, the expanded plan view of the part C would have edge parts formed in an obtuse angle in the same manner as the part B. By way of example, an edge part at the upper right corner of the cathode voltage line 230 is formed to have the same or similar angle in the same direction as the adjacent edge part of the upper power supply voltage line 210 as shown in FIG. 3. In addition, an edge part at the upper left corner of the scan driver 240 is formed to have the same or a similar angle in the same direction as the adjacent edge part of the upper power supply voltage line 210 as shown in FIG. 3.

Further, wirings disposed between the scan driver 240 and the upper power supply voltage line 210 also should include edge parts formed in the same or similar obtuse angle as in the edge part of the upper power supply voltage line 210 as illustrated in FIG. 4.

FIG. 4 is an expanded plan view of the part B of FIG. 3.

The upper power supply voltage line 210 has an upper power supply voltage line edge part 210a. A signal line 241 has a signal line edge part 241a, a scan driver power supply line 242 has a power supply line edge part 242a, and a scan driver cathode voltage line 243 has a cathode voltage line edge part 243a. The scan driver cathode voltage line 243 may also be referred to as a ground voltage line or a grounding voltage line.

As illustrated in FIG. 4, the edge part 210a of the upper power supply voltage line 210 of the organic electroluminescent display device 200 is formed in an obtuse angle. The signal line 241 includes the edge part 241a formed in an obtuse angle in the same direction as the power supply voltage line edge part 210a. The signal line 241 is arranged along the upper power supply voltage line 210 inside the edge part 210a of the upper power supply voltage line 210. Further, the power supply voltage line 242 and the scan driver cathode voltage line 243 that transmit a power supply to the scan driver 240 include edge parts 242a, 243a at their upper left corners, respectively, formed inside the signal line 241 in an obtuse angle in the same direction as the edge part 241a of the signal line 241.

For example, the edge part 210a of the upper power supply voltage line 210 should be formed in a generally rounded shape, wherein the edge part 210a is gently formed in a generally rounded shape and a large obtuse angle so that the degree of accumulation of the charges is reduced because of the characteristics of charges, which dictates that as an edge of the edge part of the upper power supply voltage line 210 becomes smaller and sharper, the degree of accumulation of charges increases.

While the edge part 210a shown in FIG. 4 as well as other edge parts in FIGS. 3 and 4 are not truly rounded or have a curvature of a curve, it may be referred to as being generally rounded in a sense that its obtuse angles are less sharp as compared to the perpendicular angles of the edge parts of the conventional organic electroluminescent display device. In other embodiments, the upper power supply voltage line as well as other wirings may have generally rounded edge parts or edge parts having different obtuse angles than those shown in FIGS. 3 and 4.

Further, conventional loss of inner wirings and metal patterns through charge damage is prevented or reduced by forming the edge parts 210a, 241a, 242a, 243a of wirings such as the upper power supply voltage line 210, the signal line 241, the scan driver power supply line 242 and the cathode voltage line 243 in a generally rounded or other shape having an obtuse angle, thereby slowing down charge difference between the wirings. Additionally, the edge parts 210a, 241a, 242a, 243a each having an obtuse angle are desirable when voltage drop is considered because the length of the wirings are shortened by forming the obtuse angle.

Further, wirings and other required components can be easily arranged by forming the edge parts 210a, 241a, 242a, 243a of respective wirings in an obtuse angle greater than 90 degrees so that an empty space without metal is formed on the substrate.

Figure 5:
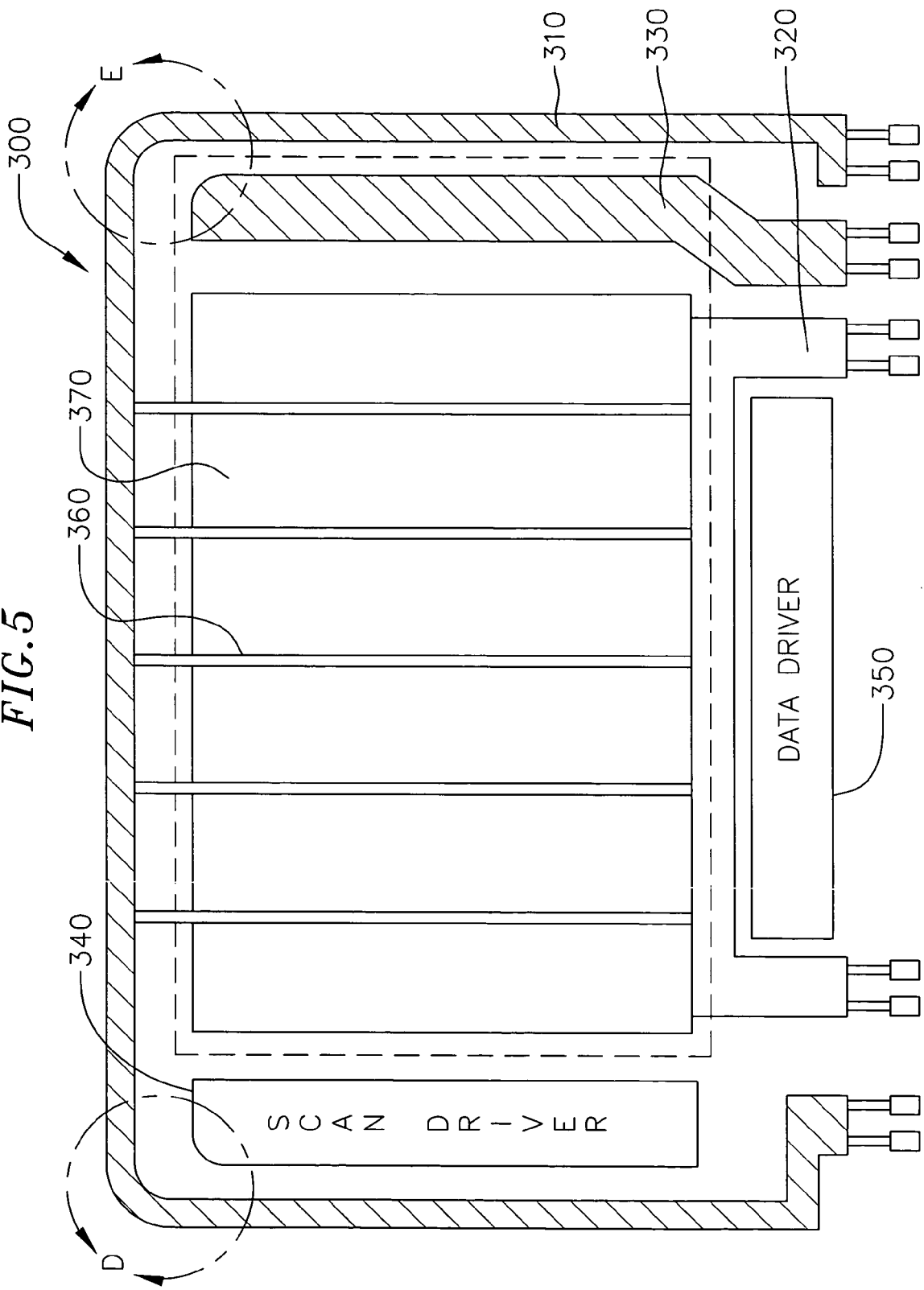
FIG. 5 is a plan view showing another exemplary embodiment according to the present invention.

FIG. 5 is a plan view showing another exemplary embodiment of the present invention.

An organic electroluminescent display device 300 includes an upper power supply voltage line 310, a lower power supply voltage line 320, a cathode voltage line 330, a scan driver 340, a data driver 350, an active power supply voltage line 360 and a pixel region 370 having a plurality of unit pixels for emitting light of certain colors, formed on a substrate.

In FIG. 5, edge parts of the upper power supply voltage line 310 in both parts D, E are generally rounded. Additionally, edge parts on wirings adjacent to the edge parts of the upper power supply voltage line 310 should also be rounded as shown in FIG. 6.

While FIG. 6 only shows an expanded plan view of the part D, the expanded plan view of the part E would have generally rounded edge parts formed in the same manner as the part D. By way of example, an edge part at the upper right corner of the cathode voltage line 330 is generally rounded in a similar manner as the adjacent edge part of the upper power supply voltage line 310 as shown in FIG. 5. In addition, an edge part at the upper left corner of the scan driver 340 is generally rounded in a similar manner as the as adjacent edge part of the upper power supply voltage line 310 as shown in FIG. 5.

Further, wirings disposed between the scan driver 340 and the upper power supply voltage line 310 also should include edge parts formed to have a generally rounded shape as in the edge part of the upper power supply voltage line 310 as illustrated in FIG. 6.

FIG. 6 is an expanded plan view of the part D of FIG. 5.

The upper power supply voltage line 310 has an upper power supply voltage line edge part 310a. A signal line 341 has a signal line edge part 341a, a scan driver power supply line 342 has a power supply line edge part 342a, and a scan driver cathode voltage line 343 has a cathode voltage line edge part 343a. The scan driver cathode voltage line 343 may also be referred to as a ground voltage line or a grounding voltage line.

As illustrated in FIG. 6, the edge part 310a of the upper power supply voltage line 310 of the organic electroluminescent display device 300 is formed to have a generally rounded shape. The signal line 341 includes the edge part 341a formed in a generally rounded shape in a similar manner as the power supply voltage line edge part 310a. The signal line 341 is arranged along the upper power supply voltage line 310 inside the edge part 310a of the upper power supply voltage line 310. Further, the power supply voltage line 342 and the scan driver cathode voltage line 343 that transmit a power supply to the scan driver 340 include edge parts 342a, 343a at their upper left corners, respectively, formed inside the signal line 341 in a generally rounded shape in a similar manner as the edge part 341a of the signal line 341.

For example, the edge part 310a of the upper power supply voltage line 310 should be formed in a generally rounded shape, wherein the edge part 310a is gently formed in a generally rounded shape so that the degree of accumulation of the charges is reduced because of the characteristics of charges, which dictates that as an edge of the edge part of the upper power supply voltage line 310 becomes smaller and sharper, the degree of accumulation of charges increases.

Conventional loss of inner wirings and metal patterns through charge damage is prevented or reduced by forming the edge parts 310a, 341a, 342a, 343a of wirings such as the upper power supply voltage line 310, the signal line 341, the scan driver power supply line 342 and the cathode voltage line 343 in a generally rounded shape, thereby slowing down charge difference between the wirings. Additionally, the edge parts 310a, 341a, 342a, 343a each having a generally rounded shape are desirable when voltage drop is considered because the length of the wirings are shortened by forming the generally rounded shape.

Further, wirings and other required components can be easily arranged by forming the edge parts 310a, 341a, 342a, 343a of respective wirings in a generally rounded shape so that an empty space without metal is formed on the substrate.

As described above, the length of the wirings is shortened in an organic electroluminescent display device according to exemplary embodiments of the present invention by forming an edge part of respective wirings formed on the substrate in an obtuse angle. The loss of the wirings and metal patterns due to charge damage is prevented or reduced by reducing the degree of accumulation of charges so that charge difference between the wirings is slowed down. Additionally, wirings are easily arranged, and other components are easily added by forming an obtuse angle on the edge part so that an empty space without metal is formed on the substrate.

While the invention has been particularly shown and described with reference to certain exemplary embodiments thereof, it will be understood by those skilled in the art that the foregoing and other changes in form and details may be made therein without departing from the spirit and scope of the invention. The scope of the present invention is indicated by the appended claims, and all changes that come within the meaning and range of equivalents thereof are intended to be embraced therein.

What is claimed is:

1. A display device comprising a substrate, a pixel region comprising a plurality of pixels formed on the substrate, a power supply voltage line for supplying a power supply voltage to the pixel region, and a cathode voltage line for supplying a cathode voltage to the pixel region, wherein the power supply voltage line comprises an edge part formed in an obtuse angle.

2. The display device according to claim 1, further comprising a wiring having an edge part adjacent to the edge part of the power supply voltage line, wherein the edge part of the wiring is formed in an obtuse angle.

3. The display device according to claim 1, wherein the cathode voltage line comprises an edge part formed in an obtuse angle.

4. The display device according to claim 1, further comprising a scan driver having an edge part formed in an obtuse angle.

5. The display device according to claim 1, wherein the display device is an organic electroluminescent display device.

6. The display device according to claim 1, wherein the edge part is formed in an obtuse angle of more than 90 degrees.

7. The display device according to claim 1, further comprising a scan driver power supply line and a scan driver cathode voltage line for supplying a power supply voltage and a cathode voltage, respectively, to a scan driver, wherein one or both of the scan driver power supply line and the scan driver cathode voltage line have an edge part having an obtuse angle.

8. A display device comprising a pixel region including a plurality of pixels, a power supply voltage line for supplying a power supply voltage to the pixel region, a cathode voltage line for supplying a cathode voltage to the pixel region, a signal line adjacent to the power supply voltage line, a scan driver power supply line for transmitting a power supply voltage to a scan driver and a scan driver cathode voltage line for transmitting a cathode voltage to the scan driver, wherein the power supply voltage line comprises an edge part formed in a generally rounded shape.

9. The display device according to claim 8, wherein the cathode voltage line and the scan driver each comprise an edge part formed in a generally rounded shape.

10. The display device according to claim 8, wherein the signal line comprises an edge part formed in a generally rounded shape.

11. The display device according to claim 8, wherein the scan driver power supply line comprises an edge part formed in a generally rounded shape.

12. The display device according to claim 8, wherein the scan driver cathode voltage line comprises an edge part formed in a generally rounded shape.

13. The display device according to claim 8, wherein the display device is an organic electroluminescent display device.

14. A display device comprising:
a pixel region; and
a power supply voltage line for supplying a power supply voltage to the pixel region, said power supply voltage line having a substantially horizontal portion having a first end and a second end, a substantially vertical portion, and an edge part interconnecting the first end of the substantially horizontal portion and the substantially vertical portion,
wherein the edge part forms an obtuse angle with both the substantially horizontal portion and the substantially vertical portion.

15. The display device of claim 14, wherein the power supply voltage line includes another substantially vertical portion, and another edge part interconnecting the second end of the substantially horizontal portion and said another substantially vertical portion, wherein said another edge part forms an obtuse angle with both the substantially horizontal portion and said another substantially vertical portion.

16. The display device of claim 14, further comprising a cathode voltage line for supplying a cathode voltage to the pixel region, said cathode voltage line having an edge part at a corner adjacent to the edge part of the power supply voltage line and formed in substantially the same direction as and at an angle which is generally the same as that of the edge part of the power supply voltage line.

17. The display device of claim 14, further comprising a scan driver for supplying a selection signal to the pixel region, said scan driver having an edge part at a corner proximate to the edge part of the power supply voltage line and formed in substantially the same direction as and at an angle which is generally the same as that of the edge part of the power supply voltage line.

18. The display device of claim 17, further comprising a scan driver power supply line for transmitting a power supply voltage to the scan driver, said scan driver power supply line having an edge part at a corner proximate to the edge part of the power supply voltage line and formed in substantially the same direction as and at an angle which is generally the same as that of the edge part of the power supply voltage line.

19. The display device of claim 18, further comprising a scan driver cathode voltage line for transmitting a cathode voltage to the scan driver, said scan driver cathode voltage line having an edge part at a corner proximate to the edge part of the power supply voltage line and formed in substantially the same direction as and at an angle which is generally the same as that of the edge part of the power supply voltage line.

20. The display device of claim 14, further comprising a signal line having a substantially horizontal portion and a substantially vertical portion and an edge part interconnecting therebetween, wherein the edge part of the signal line is adjacent to the edge part of the power supply voltage line, and formed in substantially the same direction as and at an angle which is generally the same as that of the edge part of the power supply voltage line.

21. A display device comprising:
    a pixel region having a plurality of pixels formed thereon;
    a power supply voltage line for supplying a power supply voltage to the pixel region, the power supply voltage line having a substantially horizontal portion, a first substantially vertical portion, a second substantially vertical portion, a first edge part interconnecting a first end of the substantially horizontal portion and the first substantially vertical portion, and a second edge part interconnecting a second end of the substantially horizontal portion and the second substantially vertical portion;
    a cathode voltage line disposed proximate to and substantially parallel to the second substantially vertical portion, said cathode voltage line for supplying a cathode voltage to the pixel region, and having an edge part located at a corner proximate to the second edge part and formed in substantially the same direction as and at an angle which is generally the same as that of the second edge part;
    a scan driver disposed proximate to and substantially parallel to the first substantially vertical portion, said scan driver for supplying a selection signal to the pixel region, and having an edge part located at a corner proximate to the first edge part and formed in substantially the same direction as and at an angle which is generally the same as that of the first edge part;
    a scan driver cathode voltage line disposed proximate to and substantially parallel to the scan driver, said scan driver cathode voltage line for transmitting a scan driver cathode voltage to the scan driver, and having an edge part located at a corner proximate to the first edge part and formed in substantially the same direction as and at an angle which is generally the same as that of the first edge part;
    a scan driver power supply line disposed proximate to and substantially parallel to the scan driver, said scan driver power supply line for transmitting a scan driver power supply voltage to the scan driver, and having an edge part located at a corner proximate to the first edge part and formed in substantially the same direction as and at an angle which is generally the same as that of the first edge part; and
    a signal line disposed adjacent to the power supply voltage line, and having a substantially horizontal portion, a substantially vertical portion and an edge part interconnecting therebetween, wherein the edge part of the signal line is adjacent to the first edge part and formed in substantially the same direction as and at an angle which is generally the same as that of the first edge part,
    wherein the first edge part forms an obtuse angle with both the substantially horizontal portion and the first substantially vertical portion of the power supply voltage line, and
    wherein the second edge part forms an obtuse angle with both the substantially horizontal portion and the second substantially vertical portion of the power supply voltage line.

22. The display device of claim 21, wherein the display device is an organic electroluminescent display device.

* * * * *